(12) United States Patent
Suzuki et al.

(10) Patent No.: US 6,882,667 B2
(45) Date of Patent: Apr. 19, 2005

(54) OPTICAL SEMICONDUCTOR DEVICE AND METHOD FOR CONTROLLING THE SAME

(75) Inventors: Shinya Suzuki, Yamanashi (JP); Hiromitsu Kawamura, Yamanashi (JP)

(73) Assignee: Fujitsu Quantum Devices Limited, Yamanashi (JP)

( * ) Notice: Subject to any disclaimer, the term of this patent is extended or adjusted under 35 U.S.C. 154(b) by 0 days.

(21) Appl. No.: 10/349,035

(22) Filed: Jan. 23, 2003

(65) Prior Publication Data

US 2003/0185257 A1 Oct. 2, 2003

(30) Foreign Application Priority Data

Mar. 29, 2002 (JP) .................................... 2002-098034

(51) Int. Cl.⁷ .............................. H01S 3/04; H01S 5/00
(52) U.S. Cl. .......................................... 372/36; 372/43
(58) Field of Search ............................. 372/26, 34, 36, 372/38.1–38.09, 43–50, 29.01–32, 33; 398/137

(56) References Cited

U.S. PATENT DOCUMENTS

| | | | | |
|---|---|---|---|---|
| 5,317,581 A | * | 5/1994 | Onishi et al. | 372/38.02 |
| 5,602,665 A | * | 2/1997 | Asako | 398/137 |
| 6,044,097 A | * | 3/2000 | Kawamura et al. | 372/38.01 |

* cited by examiner

Primary Examiner—Quyen Leung
(74) Attorney, Agent, or Firm—Westerman, Hattori, Daniels & Adrian, LLP (57) ABSTRACT

An optical semiconductor device includes an element in which a laser diode and an optical modulator are integrated, and a circuit that sets a common node of the laser diode and the optical modulator at a reference potential different from a ground potential and drives the laser diode and the optical modulator in opposite directions with respect to the reference potential.

22 Claims, 5 Drawing Sheets

OPTICAL SEMICONDUCTOR DEVICE AND METHOD FOR CONTROLLING THE SAME

BACKGROUND OF THE INVENTION

1. Field of the Invention

The present invention generally relates to optical semiconductor devices and methods for controlling the same, and more particularly, to an optical semiconductor device having an optical semiconductor element in which a semiconductor laser diode and an optical modulator are integrated and a method for controlling such an optical semiconductor device.

2. Description of the Related Art

In optical communications, an optical signal modulated at high speed is transmitted over an optical fiber. Generally, the optical signal may be modulated by one of the following two methods. The first method directly modulates the laser diode. The second method modulates the optical output signal of the laser diode. The second method uses an optical modulator together with the laser diode. In the past, the laser diode and the optical modulator were discrete components and were separately packaged. Recently, the laser diode and the optical modulator are integrated on a single semiconductor substrate. This kind of laser diode is called MI-LD (Modulator Integrated Laser Diode).

In MI-LD, a pn junction of the optical modulator and another pn junction of the laser diode are formed on the semiconductor substrate. Due to limitations resulting from crystal growth, the two pn junctions on the semiconductor substrate are formed in the same direction and have the same polarity. In operation, the pn junction of the laser diode is forward-biased, while the pn junction of the optical modulator is reverse-biased. Therefore, two power supplies having the opposite polarities are needed to generate the respective bias voltages. One of the two power supplies is a positive supply, and the other is a negative supply.

However, the use of two power supplies needs a large-scale circuit for driving the MI-LD.

SUMMARY OF THE INVENTION

According to the present invention, there is provided an optical semiconductor device with the laser diode and the optical modulator being incorporated, which device can be driven by a single-polarity power supply.

According to an aspect of the present invention, there is provided an optical semiconductor device comprising: an element in which a laser diode and an optical modulator are integrated; and a circuit that sets a common node of the laser diode and the optical modulator at a reference potential different from a ground potential and drives the laser diode and the optical modulator in opposite directions with respect to the reference potential.

According to another aspect of the present invention, there is provided an optical semiconductor device comprising: an element in which a laser diode and an optical modulator are integrated; and a circuit that sets a common node of the laser diode and the optical modulator at a reference potential different from a ground potential, applies a first potential having the same polarity as that of the reference potential to another node of the laser diode, and applies a second potential having the same polarity as that of the reference potential to another node of the optical modulator, the second potential serving as a reference of a modulating signal.

According to yet another aspect of the present invention, there is provided an optical semiconductor device comprising: an element in which a laser diode and an optical modulator are integrated; and a circuit that sets a common node of the laser diode and the optical modulator at a reference potential different from a ground potential, an absolute value of the reference potential being smaller than that of a potential applied to the laser diode.

According to a further aspect of the present invention, there is provided an optical semiconductor device comprising: an element in which a laser diode and an optical modulator are integrated; a first circuit that receives a single-polarity power supply potential and a ground potential from an outside of the optical semiconductor device; and a second circuit that generates a reference potential higher than the ground potential and lower than the single-polarity power supply potential and applies the reference potential to a common node of the laser diode and the optical modulator.

According to another aspect of the present invention, there is provided an optical semiconductor device comprising: an element in which a laser diode and an optical modulator are integrated; a first circuit that generates a reference potential from a power supply voltage and applies the reference potential to a common node of the laser diode and the optical modulator; a second circuit that drives the laser diode on the basis of the power supply voltage; a third circuit that supplies a modulating signal to the optical modulator; and a fourth circuit that supplies a ground potential to an inside of the optical semiconductor device.

According-to another aspect of the present invention, there is provided an optical module comprising: an optical semiconductor element in which a laser diode and an optical modulator are integrated; and a housing that houses the optical semiconductor element, the housing including a circuit as described above.

According to another aspect of the present invention, there is provided a method for controlling an optical semiconductor element in which a laser diode and an optical modulator are integrated, the method comprising the steps of: dividing a power supply voltage into two voltages having an identical polarity; and driving the laser diode and the optical modulator by the two voltages.

According to another aspect of the present invention, there is provided a method for controlling an optical semiconductor element in which a laser diode and an optical modulator are integrated, the method comprising the steps of: forward-biasing the laser diode by a first voltage; and reverse-biasing the optical module by a second voltage, the first and second voltages having an identical polarity with respect to a ground potential.

According to another aspect of the present invention, there is provided a drive circuit comprising: a first part generating a reference potential; a second part receiving a first potential having a polarity identical to that of the reference potential, a laser diode being driven by a difference between the first potential and the reference potential; and a third part generating a second potential, an optical module being driven by a difference between the reference potential and the second potential.

BRIEF DESCRIPTION OF THE DRAWINGS

Other objects, features and advantages of the present invention will become more apparent from the following detailed description when read in conjunction with the accompanying drawings, in which.

DESCRIPTION OF THE PREFERRED EMBODIMENTS

Figure 1:
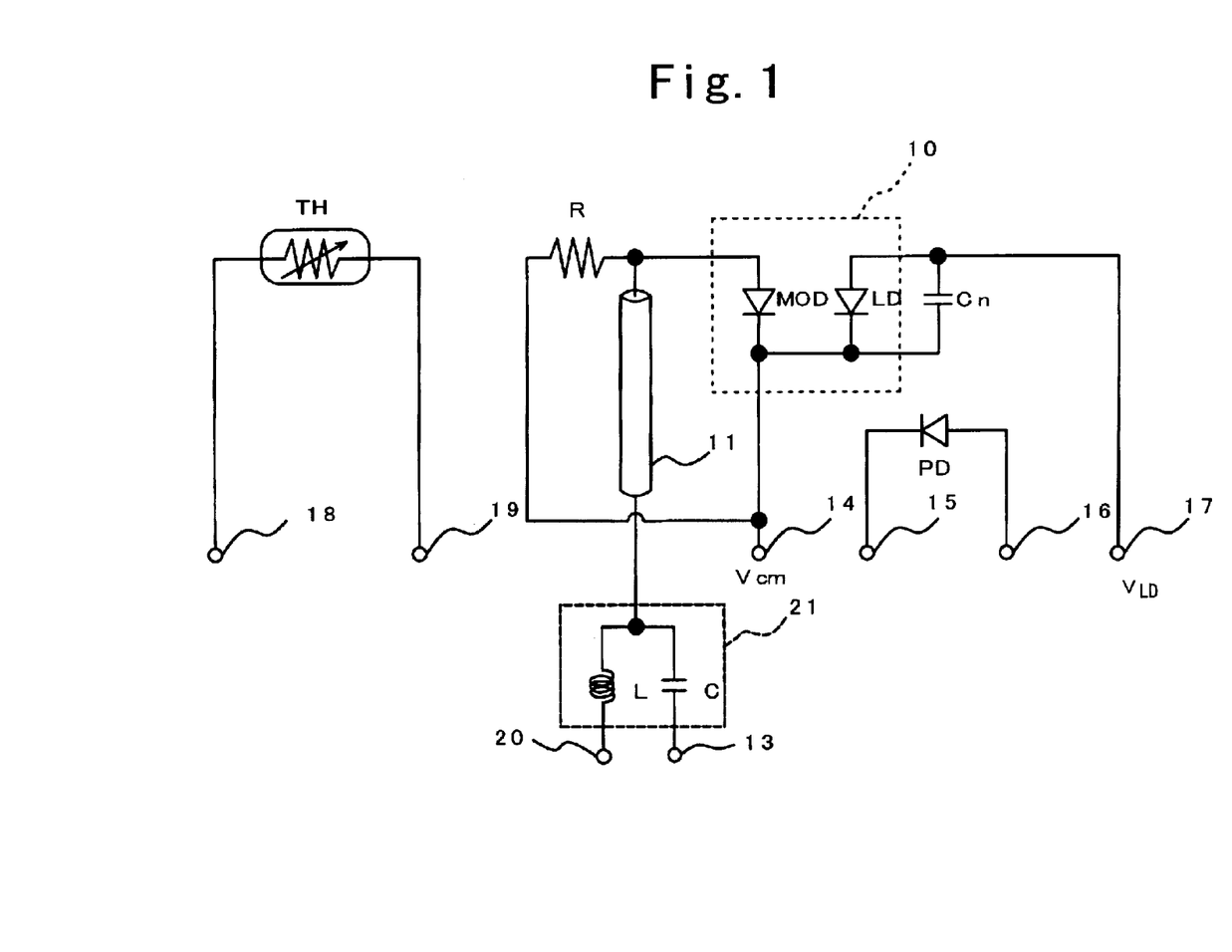
FIG. 1 illustrates an optical semiconductor device according to an aspect of the present invention.

FIG. 1 schematically shows an optical semiconductor device according to an embodiment of the present invention. The device has an optical semiconductor element 10. The element 10 is equipped with an optical modulator MOD and a semiconductor laser diode LD. The pn junction of the modulator MOD and the pn junction of the laser diode LD are formed in the same direction on a common semiconductor substrate. It is to be noted that the conventional technique uses two power supplies of opposite polarities to drive the two pn junctions.

The cathode of the laser diode LD and the cathode of the modulator MOD are set at a common potential, and are connected to a terminal 14. The terminal 14 is set at a reference potential Vcm. The anode of the modulator MOD is connected to one end of a transmission line 11. The anode of the modulator MOD is electrically coupled with the cathode thereof via a resistor R in order to match the impedance of the modulator MOD with that of the transmission line 11. The other end of the transmission line 11 is connected to one end of a bias circuit 21, which determines the anode potential of the modulator MOD. As shown in FIG. 1, the bias circuit 21 may be composed of a capacitor C and an inductor L. One end of the inductor L is connected to a terminal 20, and one end of the capacitor C is connected to a terminal 13. A modulating signal Smod is applied to the terminal 13. The modulating signal Smod passes through the capacitor C and the transmission line 11, and is applied to the anode of the modulator MOD. The terminal 20 may be set at, for example, ground potential GND. The ground potential GND is applied to the anode of the modulator MOD via the inductor L and the transmission line 11. Due to the presence of the inductor L, the modulating signal Smod is prevented from flowing to the ground. The capacitor C dc-isolates a circuit connected to the terminal 13 from the ground potential GND.

A drive voltage VLD for driving the laser diode LD is applied to a terminal 17. The drive voltage $V_{LD}$ may be equal to a power supply voltage Vcc or may be not equal thereto. For instance, the drive voltage $V_{LD}$ may be internally or externally derived from the power supply voltage Vcc. The drive voltage $V_{LD}$ has a potential with respect to the ground voltage GND. A capacitor Cn for eliminating noise is connected across the laser diode LD. A photodiode PD connected across terminals 15 and 16 is used for APC (Automatic Power Control) in which the output power of the laser diode LD is regulated at a constant level by monitoring the optical output of the laser diode LD. The APC will be described later.

A thermistor TH connected across terminals 18 and 19 is used to measure the temperature of the optical semiconductor element 10 and compensate for variation of the temperature of the optical modulator MOD (or the laser diode LD).

Figure 2:
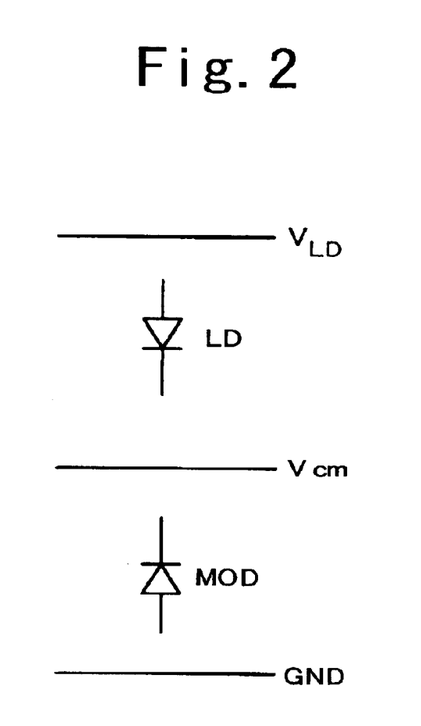
FIG. 2 illustrates a method for controlling a laser diode and an optical modulator according to an aspect of the present invention.

The common potential node of the laser diode LD and the modulator MOD, namely, the terminal 14 is set at the reference potential Vcm different from the ground potential GND, and drives the laser diode LD and the modulator MOD in the opposite directions with reference to the reference potential Vcm. The driving in the opposite directions means that the laser diode LD is forward-biased by the difference between $V_{LD}$ and Vcm and the modulator MOD is reverse-biased by the difference between Vcm and GND. In order to realize the above driving, the absolute value |Vcm| of the reference potential Vcm is set lower than the absolute value $|V_{LD}|$ of the drive voltage $V_{LD}$. The absolute values are convenient to describe the following two cases. The first case handles the drive voltage $V_{LD}$ and the reference voltage Vcm that are positive. The second case handles the drive voltage $V_{LD}$ and the reference voltage Vcm that are negative. By the settings of the drive voltage $V_{LD}$ and the reference voltage Vcm, the laser diode LD is forward-biased by the voltage $|V_{LD}|-|Vcm|$. In contrast, the cathode of the optical modulator MOD is set at the reference potential Vcm, and the anode thereof is set at the ground potential GND. Thus, the modulator MOD is reverse-biased by the voltage |Vcm|−GND. In this state, the modulating signal Smod that swings is applied to the modulator MOD as a reference of variation between the absolute value |Vcm| and the ground potential GND. FIG. 2 schematically shows biasing of the modulator MOD and laser diode LD in the first case where the drive voltage $V_{LD}$ and the reference voltage are both positive.

In the above-mentioned driving of the modulator MOD and the laser diode LD, a single-polarity power supply can be used because the drive potential $V_{LD}$ and the reference potential Vcm are both positive. That is, when the drive potential $V_{LD}$ and the reference potential Vcm are both positive, the laser diode LD and the modulator MOD can be driven by only a positive power supply. In contrast, when the drive potential $V_{LD}$ and the reference potential Vcm are both negative, the laser diode LD and the modulator MOD can be driven by only a negative power supply. According to the present invention, the laser diode LD and the optical modulator MOD can be driven by a single-polarity power supply, whereas two separate power supplies are needed to drive them in the conventional art.

The temperature compensation using the thermistor TH controls the potential of the terminal 20 on the basis of the temperature of the element 10 rather than fixing the terminal 20 to the ground potential GND.

The above-mentioned aspects of the present invention can be summarized as follows.

The optical semiconductor device according to an aspect of the invention includes the optical semiconductor element 10 in which the laser diode LD and the optical modulator MOD are integrated. The common node or terminal of the laser diode LD and the modulator MOD is set at the reference potential Vcm different from the ground potential GND. The first potential $V_{LD}$ that has the same polarity as that of the reference potential Vcm is applied to the other terminal of the laser diode LD. The ground potential or the second potential that has the same polarity as that of the reference potential Vcm is applied to the other terminal of the modulator MOD. The second potential may be a bias voltage Vbias that varies in accordance to temperature variation. The bias voltage Vbias will be described later. The absolute value of the second potential is lower than that of the reference potential Vcm.

The optical semiconductor device according to another aspect of the present invention, the common terminal of the laser diode LD and the modulator MOD is set at the reference potential Vcm that is different from the ground potential GND and has the absolute value smaller than that of the drive voltage $V_{LD}$ applied to the optical semiconductor element (more particularly, the laser diode LD).

According to yet another aspect of the present invention, the optical semiconductor device has a first circuit (terminals 17 and 20) that receives the drive voltage $V_{LD}$ and the ground potential GND, and a second circuit (terminal 14) that receives the reference potential Vcm that is between the drive voltage $V_{LD}$ and the ground potential GND and applies it to the common potential part of the laser diode LD and the modulator MOD.

The other terminal of the modulator MOD, namely, the anode thereof may be dc-grounded. The anode of the modulator MOD may be grounded via the inductor L. The other terminal of the modulator MOD, namely, the anode thereof is biased.

According to another aspect of the present invention, the optical semiconductor device is controlled by the steps of forward-biasing the laser diode LD by the first voltage $|V_{LD}|-|Vcm|$; and reverse-biasing the optical module MOD by the second voltage $|Vcm|$–GND, the first and second voltages having an identical polarity with respect to a ground potential.

Figure 3:
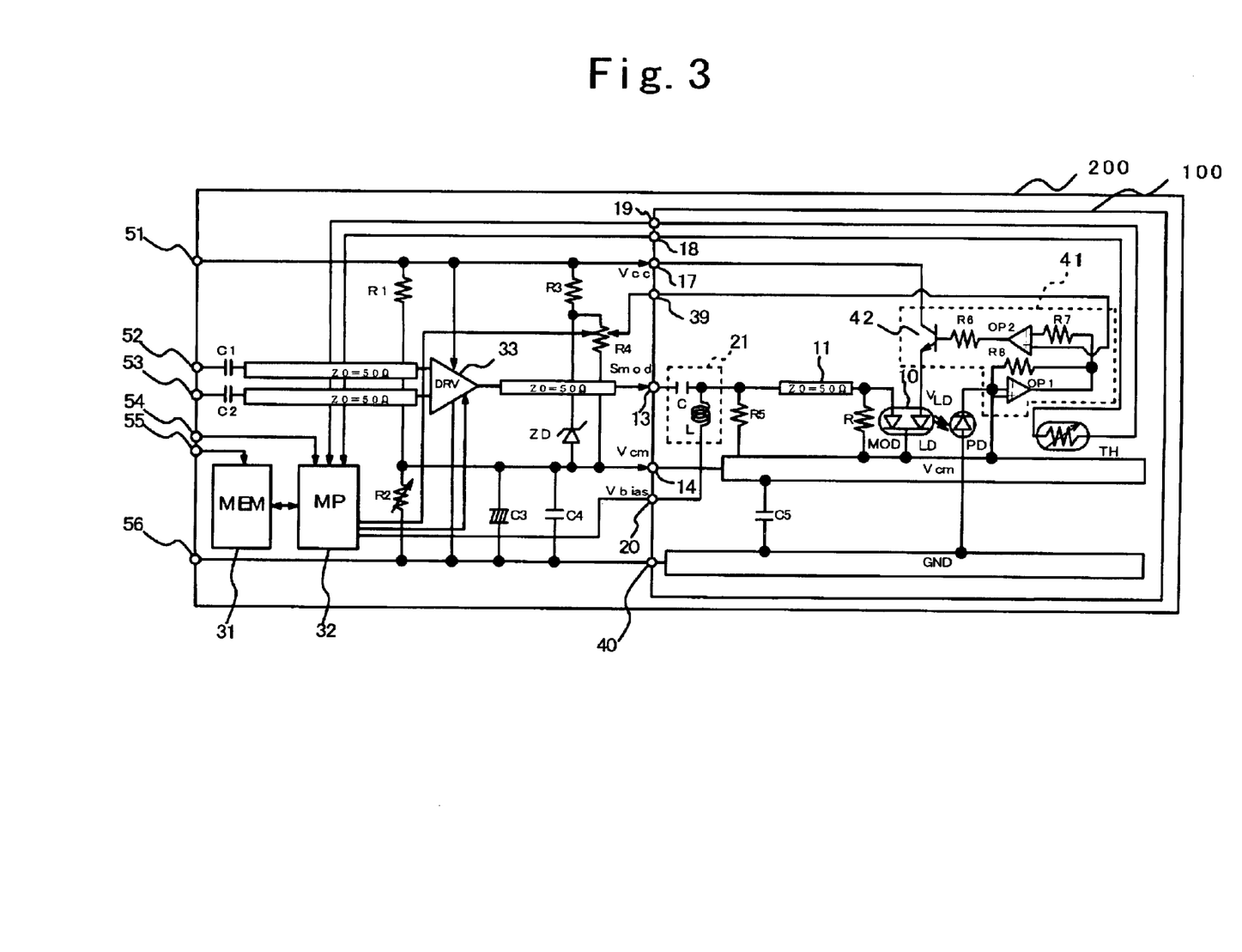
FIG. 3 is a circuit diagram of an optical semiconductor device according to an embodiment of the present invention.

FIG. 3 is a circuit diagram of an optical semiconductor device according to an embodiment of the present invention. An optical semiconductor device shown in FIG. 3 includes an optical module 100 and a unit 200. The optical module 100 corresponds to the optical semiconductor device configured according to the present invention. The unit 200 also corresponds to the optical semiconductor device configured according to the present invention. The unit 200 includes components that are integrated and may be a circuit board, a housed device or the like. Some components of the unit 200 may be provided outside of the unit 200, nevertheless the components are electrically connected as shown in FIG. 3. The unit 200 may be called optical module.

The configuration shown in FIG. 3 employs a positive power supply voltage Vcc. The optical module 100 includes the aforementioned optical semiconductor element 10, a bias circuit 21, thermistor TH, and an APC 41. The unit 200 includes the optical module 100 and a circuit for driving the optical module 100. The optical modulator MOD of the optical semiconductor element 10 is reverse-biased by the positive voltage Vcm–GND, and the laser diode LD is forward-biased by the positive voltage $V_{LD}$–Vcm.

The optical module 100 has the aforementioned terminals 13, 14, 17, 18, 19 and 20, which serve as external terminals of the optical module 100. The terminals 15 and 16 correspond to internal nodes of the optical module 100. Further, the optical module 100 has a ground terminal 40. In the description given with reference to FIG. 1, the terminal 20 may be grounded. In contrast, in the configuration of FIG. 3, the terminal 20 is not grounded but is supplied with the bias voltage Vbias that varies in accordance with temperature variation. Of course, the configuration of FIG. 3 may be changed so that the terminal 20 is connected to ground GND.

The APC 41 is made up of a transistor 42, operational amplifiers OP1 and OP2, and resistors R6–R8. The collector of the transistor 42 receives the power supply voltage Vcc via the terminal 17. The base of the transistor 42 is regulated so that the output of the laser diode LD monitored by the photodiode PD is fixed to a given constant level. The collector current based on the base voltage regulated as mentioned above flows in the transistor 42, so that the output level of the laser diode LD can be kept constant.

The bias circuit 21 is provided in the optical module 100. The modulating signal Smod applied to the terminal 13 passes through the capacitor C of the bias circuit 21 and a transmission line having a characteristic impedance of 50 ohms, and is then applied to the anode of the modulator MOD. The bias voltage Vbias that controls the anode potential of the modulator MOD is applied to the terminal 20. The bias voltage Vbias changes in the positive direction with respect to the ground potential GND. That is, the bias voltage Vbias changes on the positive side with respect to the ground potential GND. The reference voltage Vcm is connected to the ground potential GND via a capacitor C5, which allows high-frequency components to flow to the ground GND. The use of the capacitor C5 stabilizes dc circuit operation.

The unit 200 is equipped with the drive circuit for driving the optical module 100. A modulating signal is applied across terminals 52 and 53 in differential formation. The differential modulating signals pass through capacitors C1 and C2 and transmission lines having a characteristic impedance of 50 ohms, and are then applied to a driver (DRV) 33. The driver 33, which may be a single IC device or chip, derives the modulating signal Smod from the differential modulating signals. The modulating signal Smod may be a pulse signal, and is applied to the terminal 13 via a transmission line having a characteristic impedance of 50 ohms.

The power supply voltage Vcc is externally applied to a terminal 51. Resistors R1 and R2 form a series circuit connected between the power supply voltage Vcc and the ground GND, and divide the power supply voltage Vcc. A divided voltage obtained at the intermediate node via which the resistors R1 and R2 are connected in series serves as the reference potential Vcm applied to the terminal 14. The resistor R2 is a variable resistor. By adjusting the variable resistor R2, the reference potential Vcm can be varied. For example, when the power supply voltage Vcc is 5 V, the variable resistor R2 changes the reference potential Vcm in the range of 2 V–4 V. By adjusting the reference potential Vcm, the device can be adapted to various environments and users' needs. An electrolytic capacitor C3 and a capacitor C4 are connected between the above-mentioned intermediate node and ground GND. The capacitors C3 and C4 function to eliminate ac components and to stabilize the dc reference voltage Vcm.

A microprocessor 32 controls the driver 33 to change the duty ratio and/or amplitude of the modulating signal. Parameters necessary for controlling the driver 33 are stored in a memory 31. A desired duty ratio and amplitude can be set from the outside of the unit 200 by applying an associated address to the memory 31 via a terminal 55. The memory 31 may, for example, be an EEPROM (Electrically Erasable Programmable Read Only Memory). The microprocessor 32 applies the bias voltage Vbias to the terminal 20. As has been described previously, the microprocessor 32 changes the vias voltage Vbias in the positive direction with respect to the ground potential GND. More particularly, the microprocessor 32 monitors the voltage developing across the terminals 18 and 19 across which the thermistor TH is connected, and generates the bias voltage Vbias having a value dependent on the temperature measured by the thermistor TH. This will be described later with reference to FIGS. 4A and 4B. Further, the microprocessor controls a variable resistor R4.

One end of the resistor R3 is connected to the power supply voltage Vcc, and the other end thereof is connected to the reference potential Vcm via a Zener diode ZD. The Zener diode ZD defines a reference potential for APC, which is adjustable by the variable resistor R4. The microprocessor 32 controls an intermediate tap of the variable resistor R4 to thus define a desired value of the reference potential, which is applied to the operational amplifier OP2 of the APC 41.

As has been described, only the positive power supply voltage Vcc, the reference potential Vcm and ground GND are externally applied to the optical module 100. There is no negative potential at all. The unit 200 is externally supplied with only the power supply voltage Vcc. There is no negative potential at all. The reference potential Vcm is generated inside the unit 200. According to the present invention, it is possible to drive, by a single-polarity power supply, the optical semiconductor device equipped with the element in which the laser diode LD and the modulator MOD are integrated.

Figure 4A:
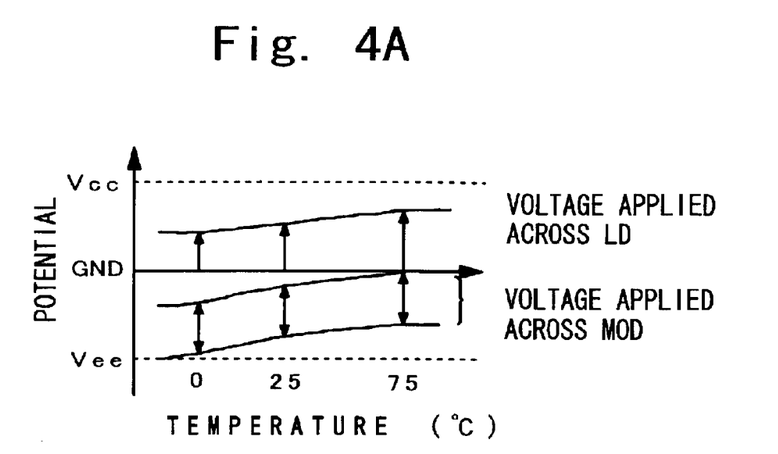
FIG. 4A shows a conventional relationship between biasing and temperature variation.
Figure 4B:
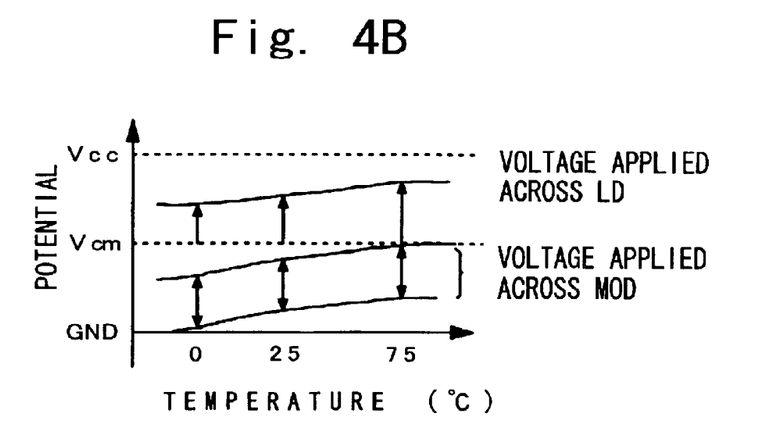
FIG. 4B shows a relationship between biasing and temperature variation according to one aspect of the present invention.

FIGS. 4A and 4B are graphs of the relationship between the voltages applied to the laser diode LD and the modulator MOD and the temperature measured in the vicinity thereof. More particularly, FIG. 4A shows the conventional driving method, and FIG. 4B shows the driving method according to one aspect of the present invention. As shown in FIG. 4A, two power supplies having the opposite polarities are used in the conventional method, in which the common node of the optical modulator MOD and the laser diode LD is set at the ground potential GND. A negative voltage Vee with respect to the ground potential GND is applied to the modulator MOD, whereas the positive voltage Vcc is applied to the laser diode LD. In contrast, according to the embodiment of the present invention, the device operates with respect to the reference potential Vcm higher than the ground potential GND. The control based on temperature variation changes the voltage applied across the modulator MOD.

If the absolute value |Vbias| becomes smaller than ½ of the amplitude of the modulating signal Smod, the voltage applied across the modulator MOD may be instantaneously opposite to the polarity of the bias voltage Vbis. However, the average of the amplitude of the modulating signal Smod constantly assumes the original polarity.

Now, some aspects of the device shown in FIG. 3 according to the present embodiment of the invention are described below.

The optical semiconductor device shown in FIG. 3 includes the optical semiconductor element 10 in which the laser diode LD and the optical modulator MOD are integrated, and a circuit that includes the terminal 51 and the microprocessor 32. This circuit sets the common node (cathode) of the laser diode LD and the optical modulator MOD at the reference potential Vcm different from the ground potential GND. The circuit applies the first potential Vcc having the same polarity as that of the reference potential Vcm to another node (anode) of the laser diode LD. Further, the circuit applies the second potential Vbias having the same polarity as that of the reference potential Vcm to another node (anode) of the optical modulator MOD, the second potential serving as the reference of the modulating signal Smod.

According to another aspect of the present embodiment of the invention, the device shown in FIG. 3 includes a circuit includes the resistors R1 and R2. This circuit sets the common node (cathode) of the laser diode LD and the optical modulator MOD at the reference potential Vcm different from the ground potential GND. The absolute value |Vcm| of the reference potential Vcm is smaller than the potential |Vcc| of the potential Vcc applied to the laser diode LD.

According to yet another aspect of the present embodiment of the invention, the device shown in FIG. 3 includes a first circuit including the resistors R1 and R2, a second circuit having the terminal 51, a third circuit having the driver 33, and a fourth circuit having the terminal 56. The first circuit generates the reference potential Vcm from the power supply voltage Vcc and applies the reference potential Vcm to the common node (cathode) of the laser diode LD and the optical modulator MOD. The second circuit drives the laser diode LD on the basis of the power supply voltage Vcc. The third circuit supplies the modulating signal Smod to the optical modulator MOD. The fourth circuit supplies the ground potential GND to the inside of the optical semiconductor device.

According to another aspect of the present embodiment of the invention, the device is controlled by a method of including the steps of dividing the power supply voltage Vcc into two voltages Vcc ($V_{LD}$) and Vcm having an identical polarity, and driving the laser diode LD and the optical modulator MOD by the two voltages.

According to another aspect of the present embodiment of the invention, the drive circuit provided in the unit 200 includes a first part (R1, R2) generating the reference potential Vcm, and a second part receiving the first potential Vcc having the same polarity as that of the reference potential Vcm. The laser diode LD is driven by the difference between the first potential Vcc and the reference potential Vcm. The drive circuit further includes a third part (microprocessor 32) generating the second potential Vbias. The optical module MOD is driven by the difference between the reference potential Vcm and the second potential Vbias.

Figure 5:
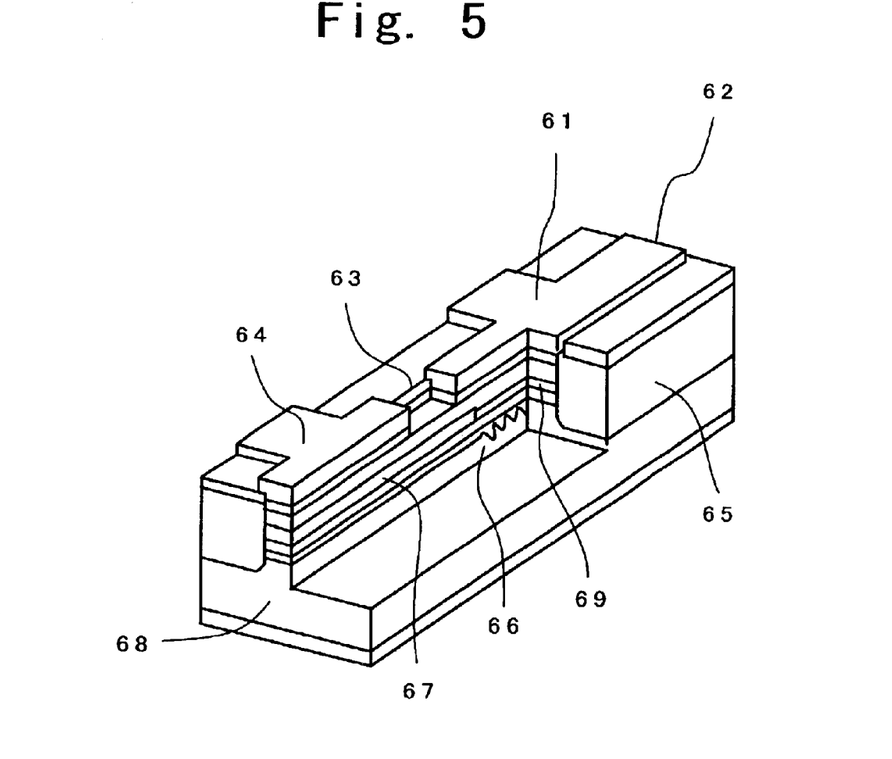
FIG. 5 is a perspective view of an optical semiconductor element with a laser diode and an optical modulator being integrated.

FIG. 5 is a perspective view of the optical semiconductor element 10. The element 10 includes a DFB (Distributed Feedback) laser diode 61 and an optical modulator 64. The DFB laser diode 61 corresponds to the aforementioned laser diode LD, and the optical modulator 64 corresponds to the aforementioned optical modulator MOD. The DFB laser diode 61 and the optical modulator 64 are isolated from each other via an insulating part 63. A reference numeral 69 denotes an active layer, and 66 denotes a butt-joint coupling. A reference number 67 denotes an absorption layer, and 65 denotes a semi-insulating indium phosphorus (SI-InP) burying layer. A high-reflection coating is provided on a surface denoted by a reference numeral 62. An anti-reflection coating is provided on a surface denoted by a reference numeral 68. The present invention is not limited to the element 10 shown in FIG. 5 but includes other optical semiconductor elements.

Figure 6:
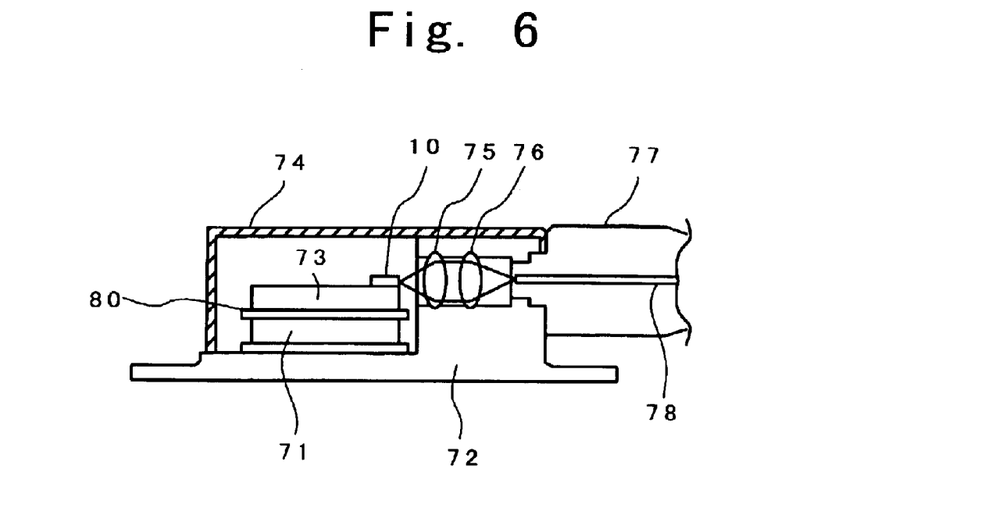
FIG. 6 illustrates the entire structure of an optical module.

FIG. 6 schematically shows the entire structure of the optical module 100. The optical semiconductor element is provided on a carrier 73 made of, for example, ceramics. Electrodes and interconnection lines of Au are formed on the upper and lower surfaces of the carrier 73. The carrier 73 is installed above a Peltier element 71 via an insulating layer 80. The Peltier element 71 is fixed to a base 72. It is possible to omit the Peltier element 71 from the optical module 100. Principally, the configuration shown in FIG. 3 does not need temperature control using the Peltier element 71. In this case, the optical module 100 equipped with no Peltier element may be miniaturized. Two aspherical lenses 75 and 76, which forms an optical system, are provided on the base 72. These lenses function to collect light emitted by the laser diode LD (61 in FIG. 5) to the input end of an optical fiber cable 78 attached to the optical module by means of a coupling connector 77. A seal cover 74, which serves as a housing, covers the optical module. According to an aspect of the present invention, the optical module 100 includes the drive circuit composed of the aforementioned first through third parts.

The present invention is based on Japanese patent application no. 2002-098034 filed on Mar. 29, 2002, the entire disclosure of which is hereby incorporated by reference.

The present invention is not limited to the specifically disclosed embodiments, and other embodiments, variations and modifications may be made without departing from the scope of the present invention.

What is claimed is:

1. An optical semiconductor device comprising:
   an element in which a laser diode and an optical modulator are integrated; and
   a circuit that sets a common node of the laser diode and the optical modulator at a reference potential different from a ground potential and drives the laser diode and the optical modulator in opposite directions with respect to the reference potential.

2. The optical semiconductor device according to claim 1, further comprising a circuit that adjusts the reference potential.

3. The optical semiconductor device according to claim 1, further comprising a circuit that compensates for variation in a modulating signal applied to the optical modulator in accordance with a temperature of the element.

4. The optical semiconductor device according to claim 1, further comprising a circuit that controls the laser diode so that the laser diode has a constant output level.

5. The optical semiconductor device according to claim 1, wherein the laser diode and the optical modulator are formed on an identical semiconductor chip.

6. The optical semiconductor device according to claim 1, wherein another terminal of the optical modulator is dc-grounded.

7. The optical semiconductor device according to claim 1, wherein another terminal of the optical modulator is grounded via an inductor.

8. An optical semiconductor device comprising:
an element in which a laser diode and an optical modulator are integrated; and
a circuit that sets a common node of the laser diode and the optical modulator at a reference potential different from a ground potential, applies a first potential having the same polarity as that of the reference potential to another node of the laser diode, and applies a second potential having the same polarity as that of the reference potential to another node of the optical modulator, the second potential serving as a reference of a modulating signal.

9. The optical semiconductor device according to claim 8, wherein an absolute value of the first potential is larger than that of the second potential.

10. The optical semiconductor device according to claim 8, wherein the second potential is adjustable.

11. An optical semiconductor device comprising:
an element in which a laser diode and an optical modulator are integrated; and
a circuit that sets a common node of the laser diode and the optical modulator at a reference potential different from a ground potential,
an absolute value of the reference potential being smaller than that of a potential applied to the laser diode.

12. An optical semiconductor device comprising:
an element in which a laser diode and an optical modulator are integrated;
a first circuit that receives a single-polarity power supply potential and a ground potential from an outside of the optical semiconductor device; and
a second circuit that generates a reference potential higher than the ground potential and lower than the single-polarity power supply potential and applies the reference potential to a common node of the laser diode and the optical modulator.

13. An optical semiconductor device comprising:
an element in which a laser diode and an optical modulator are integrated;
a first circuit that generates a reference potential from a power supply voltage and applies the reference potential to a common node of the laser diode and the optical modulator;
a second circuit that drives the laser diode on the basis of the power supply voltage;
a third circuit that supplies a modulating signal to the optical modulator; and
a fourth circuit that supplies a ground potential to an inside of the optical semiconductor device.

14. The optical semiconductor device according to claim 13, wherein:
the first circuit comprises a voltage dividing circuit across which the power supply voltage with respect to the ground potential is applied; and
a divided voltage generated by the voltage dividing circuit is applied to the common node of the laser diode and the optical modulator.

15. The optical semiconductor device according to claim 13, wherein:
the first circuit comprises a series circuit of resistors connected in series between the power supply voltage and the ground potential; and an intermediate node of the series circuit of resistors is connected to the common node of the laser diode and the optical modulator.

16. The optical semiconductor device according to claim 15, wherein the resistors include a variable resistor.

17. The optical semiconductor device according to claim 13, wherein the first through fourth circuits and the element are incorporated in a unit.

18. An optical module comprising:
an optical semiconductor element in which a laser diode and an optical modulator are integrated; and
a housing that houses the optical semiconductor element, the housing including a drive circuit having:
a first part generating a reference potential;
a second part receiving a first potential having a polarity identical to that of the reference potential, the laser diode being driven by a difference between the first potential and the reference potential; and
a third part generating a second potential, the optical modulator being driven by a difference between the reference potential and the second potential.

19. The optical module as claimed in claim 18, wherein the housing comprises an optical system that transfers an optical output of the laser diode to an optical transmission medium.

20. A method for controlling an optical semiconductor element in which a laser diode and an optical modulator are integrated, the method comprising the steps of:
dividing a power supply voltage into two voltages having an identical polarity; and
driving the laser diode and the optical modulator by the two voltages.

21. A method for controlling an optical semiconductor element in which a laser diode and an optical modulator are integrated, the method comprising the steps of:
forward-biasing the laser diode by a first voltage; and
reverse-biasing the optical modulator by a second voltage, the first and second voltages having an identical polarity with respect to a ground potential.

22. A drive circuit driving a laser diode and an optical modulator comprising:
a first part generating a reference potential;
a second part receiving a first potential having a polarity identical to that of the reference potential, the laser diode being driven by a difference between the first potential and the reference potential; and
a third part generating a second potential, the optical modulator being driven by a difference between the reference potential and the second potential.

* * * * *